United States Patent
van Bentum et al.

(10) Patent No.: US 7,138,320 B2
(45) Date of Patent: Nov. 21, 2006

(54) ADVANCED TECHNIQUE FOR FORMING A TRANSISTOR HAVING RAISED DRAIN AND SOURCE REGIONS

(75) Inventors: Ralf van Bentum, Radebeul (DE); Scott Luning, Poughkeepsie, NY (US); Andy Wei, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 56 days.

(21) Appl. No.: 10/974,232

(22) Filed: Oct. 24, 2004

(65) Prior Publication Data

US 2005/0093075 A1 May 5, 2005

(30) Foreign Application Priority Data

Oct. 31, 2003 (DE) .................. 103 51 039
Nov. 3, 2003 (DE) .................. 103 51 237

(51) Int. Cl.
*H01L 21/336* (2006.01)
(52) U.S. Cl. .................. 438/300; 257/E21.43
(58) Field of Classification Search .......... 438/225, 438/226; 257/18, 19
See application file for complete search history.

(56) References Cited

U.S. PATENT DOCUMENTS

| | | | | |
|---|---|---|---|---|
| 5,972,762 A | * | 10/1999 | Wu | 438/305 |
| 6,127,233 A | * | 10/2000 | Rodder | 438/300 |
| 6,326,664 B1 | * | 12/2001 | Chau et al. | 257/344 |
| 2003/0098479 A1 | * | 5/2003 | Murthy et al. | 257/288 |
| 2004/0173815 A1 | * | 9/2004 | Yeo et al. | 257/192 |

* cited by examiner

*Primary Examiner*—Michael Lebentritt
*Assistant Examiner*—Cheung Lee
(74) *Attorney, Agent, or Firm*—Williams, Morgan & Amerson, P.C.

(57) ABSTRACT

By recessing a semiconductor layer, preferably by locally oxidizing the semiconductor layer, a stress-inducing material and/or a dopant species may be introduced into the thinned semiconductor layer in the vicinity of a gate electrode structure by means of a subsequent epitaxial growth process. In particular, the stress-inducing material formed adjacent to the gate electrode structure exerts compressive or tensile stress, depending on the type of material deposited, thereby also enhancing the mobility of the charge carriers in a channel region of the transistor element.

12 Claims, 6 Drawing Sheets

ADVANCED TECHNIQUE FOR FORMING A TRANSISTOR HAVING RAISED DRAIN AND SOURCE REGIONS

BACKGROUND OF THE INVENTION

1. Field of the Invention

The present invention generally relates to the fabrication of integrated circuits, and, more particularly, to the formation of field effect transistors having extremely shallow PN junctions.

2. Description of the Related Art

The fabrication of integrated circuits requires the formation of a large number of circuit elements on a given chip area according to a specified circuit layout. Generally, a plurality of process technologies are currently practiced, wherein, for logic circuitry, such as microprocessors, storage chips and the like, CMOS technology is currently the most promising approach, due to the superior characteristics in view of operating speed and/or power consumption. During the fabrication of complex integrated circuits using CMOS technology, millions of complementary transistors, i.e., N-channel transistors and P-channel transistors, are formed on an appropriate substrate. Typically, a MOS transistor, irrespective of whether an N-channel transistor or a P-channel transistor is considered, comprises so-called PN junctions that are formed at an interface of highly doped drain and source regions with an inversely doped channel region disposed between the drain region and the source region. The conductivity of the channel region is controlled by a gate electrode formed above the channel region and separated therefrom by a thin insulating layer. The conductivity of the channel region depends on the dopant concentration, the mobility of the majority charge carriers, and, for a given extension of the channel region in the transistor width direction, the distance between the source and drain region, which is also referred to as channel length. Hence, in combination with the capability of rapidly creating a conductive channel below the insulating layer upon application of a specified control voltage to the gate electrode, the conductivity of the channel region substantially determines the characteristics of the MOS transistors. For this reason, the channel length represents a dominant design criterion and a size reduction thereof provides increased operating speed of the integrated circuits.

The shrinkage of the transistor dimensions, however, entails a plurality of issues associated therewith, which have to be addressed so as to not unduly offset the advantages obtained by steadily decreasing the channel length of MOS transistors.

One problem in this respect is the requirement of extremely shallow PN junctions. That is, the depth of the source and drain regions with respect to an interface formed by the gate insulating layer and the channel region has to be decreased as the channel length is reduced so as to maintain the required controllability of the conductive channel. The depth of the source and drain regions substantially determines the sheet resistance thereof, which may not be arbitrarily reduced by correspondingly increasing the dopant concentration in the source and drain regions, since an extremely high dopant concentration may give rise to increased leakage currents. Furthermore, the dopants implanted into these regions at very high concentrations may not be completely activated by conventional rapid thermal anneal cycles without negatively affecting the overall dopant profile within the source and drain regions. That is, for a desired channel length, defined by the PN junctions, an increased dopant concentration requires higher temperatures and/or a prolonged duration of the corresponding anneal cycles, thereby, however, influencing the dopant profile forming the PN junctions by the inevitable thermal diffusion of the dopants, which finally may lead to a non-acceptable variation of the finally achieved channel length.

In an attempt to further reduce the sheet resistance of the drain and source regions, the conductivity thereof is frequently increased by forming a metal silicide of superior conductivity compared to a highly doped silicon. However, since the penetration depth of the metal silicide is restricted by the depth of the PN junctions, the improvement in gaining conductivity in these regions is therefore coupled to the depth of the corresponding PN junctions. Moreover, in many CMOS technologies, a corresponding metal silicide is simultaneously formed on the gate electrode, wherein a shallow junction depth therefore also creates a very shallow metal silicide in the gate electrode, thereby providing only limited improvement in gaining superior gate electrode conductivity.

In one approach, extremely shallow source and drain regions may be formed by raising the source and drain regions above the gate insulation layer/channel region interface and maintaining the drain-source dopant concentration at an acceptable level while providing the possibility of forming highly conductive metal silicide regions without being restricted by the actual depth of the PN junctions due to the increased size of the raised drain and source regions.

With reference to FIGS. 1a–1d, a typical conventional process flow for forming raised drain and source regions will now be described in more detail. FIG. 1a schematically shows a cross-sectional view of a field effect transistor 100 at an early manufacturing stage. The transistor 100 comprises the substrate 101, for instance a bulk silicon substrate or a silicon-on-insulator (SOI) substrate including a buried insulating layer. Above the substrate 101, a substantially crystalline layer 102 is formed with a thickness that is appropriate for forming PN junctions and a channel region therein. For instance, the transistor 100 may represent an SOI transistor with a thickness of the silicon layer 102 in the range of approximately 20–100 nm. A gate electrode 103, comprised of polysilicon, is formed above the silicon layer 102 and is separated therefrom by a gate insulation layer 104. The gate insulation layer 104 may be formed in sophisticated devices by a nitrogen-containing silicon dioxide layer with a thickness of approximately 0.6–4.0 nm. The residue 105 of an anti-reflective coating covers a top surface 103a of the gate electrode 103, while the sidewalls 103b thereof, as well as the remaining surface of the silicon layer 102, are covered by an oxide liner 106.

The transistor 100 as shown in FIG. 1a may be formed in accordance with the following process flow. The substrate 101 may be obtained by a manufacturer of respective substrates in the form of a silicon bulk substrate or in the form of an SOI substrate, wherein the SOI substrate may comprise a crystalline silicon layer that may be formed in accordance with well-established wafer bonding techniques. The silicon layer 102 having the appropriate thickness may then be formed by corresponding process techniques, such as chemical mechanical polishing to thin a given silicon layer of an SOI substrate to a desired thickness and/or by epitaxial growth of silicon on the exposed surface of the SOI substrate or the bulk substrate. The epitaxial growth technique of a semiconductor material is a deposition technique in which the deposited material layer forms a crystalline structure in conformity with the crystalline structure of the underlying material as long as the deposited material is able to form a lattice that is sufficiently similar in structure and lattice spacing to the lattice of the underlying material. After the formation of the silicon layer 102, an insulating layer is formed having a thickness and a composition that are appropriate for forming the gate insulation layer 104. To this end, sophisticated oxidation and/or deposition techniques may be used as are well established in the art. Thereafter, a polysilicon layer of appropriate thickness is deposited by low pressure chemical vapor deposition. Next, an anti-reflective coating, for instance comprised of silicon oxynitride, and a resist layer are deposited and are patterned by sophisticated photolithography so as to form an etch mask for a subsequent anisotropic etch process for patterning the gate electrode 103 from the deposited polysilicon layer. Thereafter, the gate insulation layer 104 may be patterned and subsequently the oxide liner 106 may be formed by an appropriately designed oxidation process.

FIG. 1b schematically shows the transistor 100 having formed thereon sidewall spacer elements 107 comprised of a material, such as silicon nitride, that exhibits a moderately high etch selectivity with respect to the underlying oxide liner 106 so that the spacers 107 may be readily removed after a selective epitaxial growth process. The sidewall spacers 107 may be formed by well-established techniques including the deposition, for instance by plasma enhanced chemical vapor deposition, of a silicon nitride layer of a specified thickness and a subsequent anisotropic etch process, which reliably stops on and in the liner oxide 106, thereby leaving the spacers 107. A width 107a of the spacer 107 is readily controllable by appropriately adjusting the thickness of the silicon nitride layer. Hence, a lateral extension of epitaxial growth regions adjacent to the gate electrode 103 is substantially determined by the spacer width 107a.

FIG. 1c schematically shows the device 100 with selectively grown silicon regions 108 above the silicon layer 102, wherein a lateral distance of the regions 108 from the gate electrode 103 substantially corresponds to the spacer width 107a (FIG. 1b) plus the minimal thickness of the liner oxide 106. The transistor 100 as shown in FIG. 1c may be obtained by the following processes. Starting from the device as shown in FIG. 1b, the liner oxide 106 is selectively etched so as to expose the silicon layer 102 at portions that are not covered by the spacers 107, the gate electrode 103, and any isolation structures (not shown). Before and/or after the removal of the liner oxide 106, well-established cleaning procedures may be carried out to remove oxide residues and other contaminants that may have accumulated in a surface region of the silicon layer 102. Thereafter, silicon is selectively grown on exposed portions of the silicon layer 102, thereby forming the silicon regions 108 with a specified thickness in conformity with design requirements. Thereafter, the spacer 107 is removed by a selective etch process, for instance by using hot phosphoric acid, which exhibits an excellent etch selectivity to silicon dioxide and silicon. During this etch process, the residue 105 on top of the gate electrode 103 may also be removed. Thereafter, a conventional process sequence may be performed, as is the case for transistor devices without having the additional selectively grown silicon regions 108. That is, an appropriate number of sidewall spacers may be formed, followed by appropriately designed implantation sequences, so as to establish a required dopant profile in the silicon layer 102.

FIG. 1d schematically shows the transistor 100 after the above mentioned transistor formation process using, for instance, three different sidewall spacers. In FIG. 1d, a first sidewall spacer 109, for instance comprised of silicon dioxide, is located adjacent to the oxide liner 106 and has an appropriate thickness for profiling the dopant concentration in the vicinity of the gate electrode 103 during a subsequent implantation sequence. A second spacer 110 is located next to the first spacer 109 and separated therefrom by an additional liner 106a, followed by an oxide liner 111 and a third spacer 112. The width of these spacers 109 and 112 is appropriately selected to obtain the desired dopant extension regions 113 and the drain and source regions 114, thereby defining a channel region 115 between the extensions 113 with a specified channel length 116.

During the formation of the spacer 109 when comprised of silicon dioxide, the liner 106 is typically etched off the surface portion of the semiconductor layer 102. Therefore, usually the additional liner 106a is deposited prior to the formation of the spacer 110 to provide an etch stop layer. If the first spacer 109 is comprised of silicon nitride, the liner 106 is preserved during the anisotropic etch for forming the spacer 109, however, possibly with an inhomogeneous thickness owing to the etch-induced damage. Therefore, the liner 106 may be removed and the additional liner 106a may also be deposited in this case. The formation of the spacers 109, 110 and 112 may be accomplished by well-established spacer technologies, such as described with reference to the spacer 107, wherein the corresponding spacer width may be controlled by the corresponding deposition thicknesses of the respective spacer layers, for instance comprised of silicon nitride, wherein the first spacer 109 and the oxide liner 111 provide the required etch selectivity in anisotropically patterning the spacers.

As a result, the above-described process flow enables the formation of required shallow PN junctions in the form of the extensions 113, while nevertheless providing a low contact resistance to the drain and source regions 114 by providing the additional selectively grown silicon regions 108, which may be used to receive a highly conductive metal silicide, wherein the silicidation process does not adversely affect the extensions 113, nor is the silicidation process restricted by the depth of the extensions 113 and the drain and source regions 114.

Although the process flow described above provides significant improvements in forming raised drain and source regions, the problem of the restricted channel conductivity still remains since, as previously explained, the channel conductivity depends on the channel length 116 as well as on the dopant concentration within the extensions 113 and the channel region 115. The channel length 116 is substantially determined by the dimensions of the gate electrode 103 and thus a further reduction of the channel length 116 requires an enhanced resolution of the photolithography in the conventional process flow. On the other hand, a further increase of the dopant concentration may lead to increased leakage currents during the transistor operation and may also necessitate sophisticated anneal cycles, thereby possibly adversely affecting the dopant profile in the extensions 113 and the drain and source regions 114. Consequently, further improvements of the conventional process flow are required so as to obtain superior device characteristics for a given channel length 116.

In an effort to improve the channel conductivity, it has been suggested to create tensile or compressive stress in the channel region 115, thereby enhancing the mobility of electrons and holes, respectively. It has been stated that the application of tensile or compressive stress may increase the mobility of charge carriers up to about 20% for a given dopant profile and channel length. The generation of stress in the channel region 115 may, however, entail substantial changes of the above-described well-approved process sequence when a strain layer is formed in the channel region 115 as is suggested in some known process strategies.

In view of the above situation, there is a need for an improved technique that enables the formation of raised source and drain regions substantially in accordance with a conventional process flow while still providing the potential for improving the transistor characteristics by, for instance, increasing the channel conductivity.

The present invention is directed to overcoming, or at least reducing the effects of, one or more of the problems set forth above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of raised drain and source regions by epitaxial growth while still providing the possibility of enhancing the transistor characteristics in that a strain layer may be introduced into the drain and source regions during the epitaxial growth process and/or by providing the potential for controllably modifying the dopant profile of the drain and source regions during the epitaxial growth process.

According to one illustrative embodiment of the present invention, a method comprises forming a gate electrode having a first sidewall and a second sidewall above a semiconductor layer. A first recess and a second recess are formed in the semiconductor layer, wherein the first and second recesses are laterally spaced apart from the first and second sidewalls of the gate electrode. Moreover, a material is epitaxially grown in the first and second recesses so as to form a raised drain region and a raised source region.

According to another illustrative embodiment of the present invention, a method comprises forming an oxidation mask over a semiconductor layer and selectively oxidizing exposed portions of the semiconductor layer. Then, the selectively oxidized portions of the semiconductor layer are removed to form a recess adjacent to the oxidation mask. Finally, a material is epitaxially grown in the recess so as to extend above a surface portion of the semiconductor layer covered by the oxidation mask, wherein the epitaxially grown material has a lattice constant that differs from that of the semiconductor material forming the semi-conductor layer, thereby creating stress in a region adjacent to and below the oxidation mask.

In accordance with yet another illustrative embodiment of the present invention, a transistor comprises a gate electrode structure including a gate insulation layer separating a gate electrode from a channel region formed by a doped first semiconductor material having a first lattice spacing. The transistor further comprises a drain region and a source region formed adjacent to the gate electrode structure and including the first semiconductor material and a second material, wherein the second material has a second lattice spacing that differs from the first lattice spacing so as to create stress in the channel region.

BRIEF DESCRIPTION OF THE DRAWINGS

The invention may be understood by reference to the following description taken in conjunction with the accompanying drawings, in which like reference numerals identify like elements, and in which.

Figure 1A:
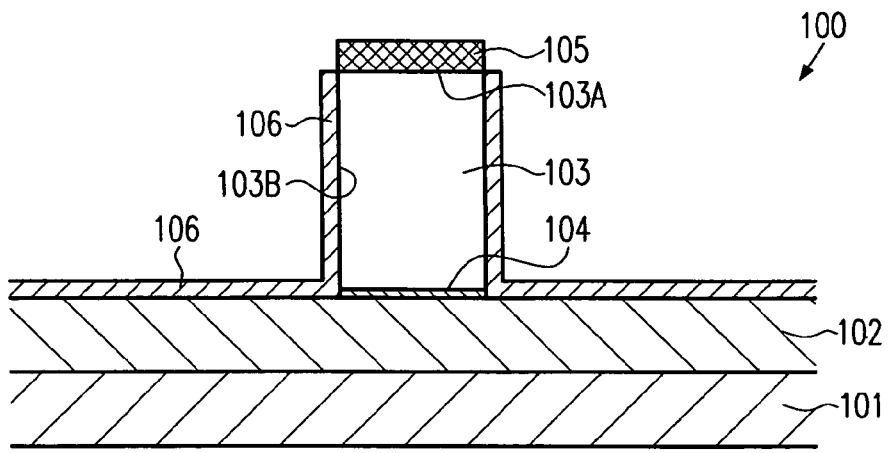
FIGS. 1a–1d schematically show cross-sectional views of a conventional transistor device including raised drain and source regions during various manufacturing stages.
Figure 1B:
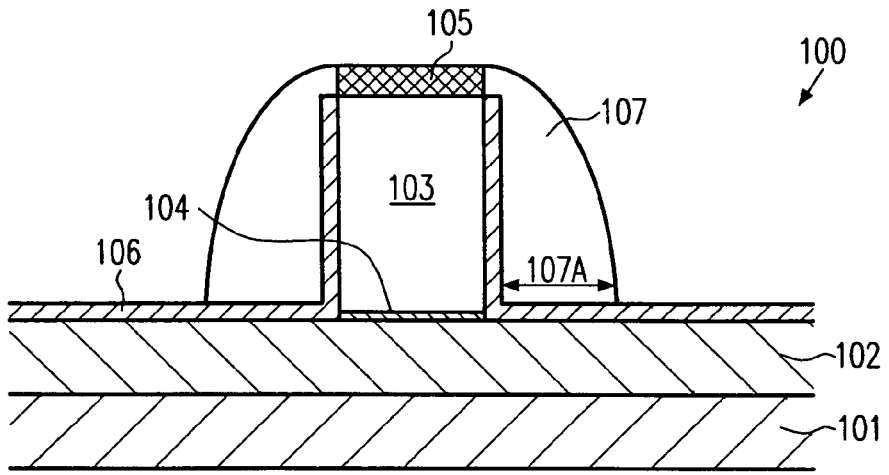
Figure 1C:
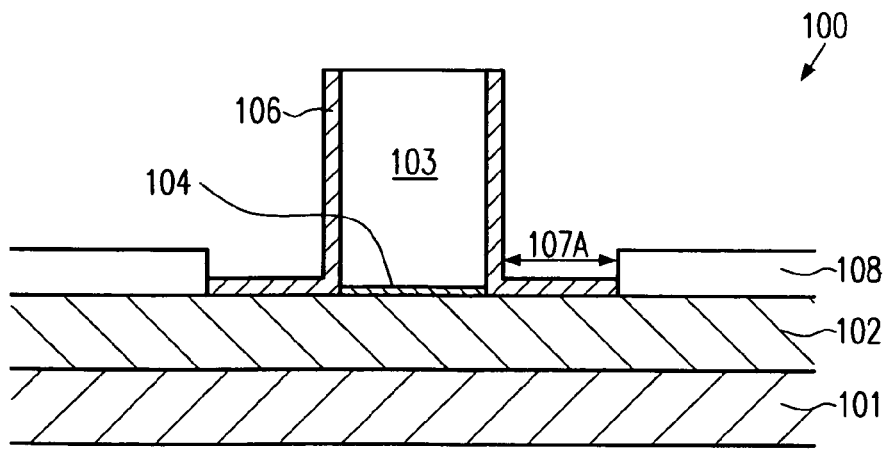

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that a replaceable mask or spacer may be used for forming raised drain and source regions, wherein, prior to performing a selective epitaxial growth process, a recess is formed, in one particular embodiment by a highly controllable oxidation process, so as to provide the potential to introduce a specified dopant concentration and/or a stress-inducing layer during the epitaxial growth of the raised drain and source regions within the recesses.

With reference to FIGS. 2a–2f, further illustrative embodiments of the present invention will now be described in more detail, wherein a high degree of compatibility with the conventional process flow as described with reference to FIGS. 1a–1d is maintained while nevertheless providing an improved channel conductivity by enhancing the dopant profile and/or by including a stress-inducing material layer adjacent to the channel region.

Figure 2A:
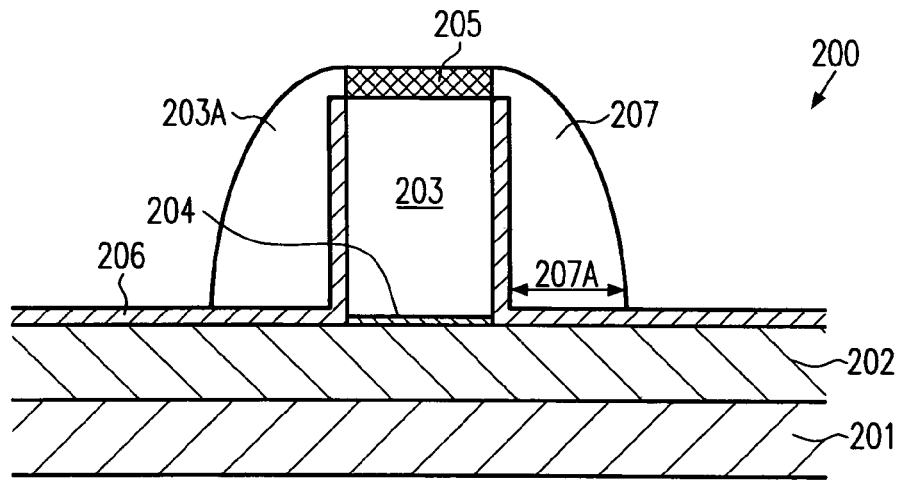
FIGS. 2a–2f schematically show cross-sectional views of a transistor element during various manufacturing stages, wherein a stress-inducing layer is integrated into raised drain and source regions according to illustrative embodiments of the present invention.

FIG. 2a schematically shows a cross-sectional view of a transistor device 200 including a substrate 201 having formed thereon a substantially crystalline semiconductor layer 202, for instance a silicon layer, as the vast majority of integrated circuits are manufactured on the basis of silicon. It should be appreciated, however, that any other appropriate semiconductor material, such as II–VI or III–V semiconductor compounds, may be used to form the semiconductor layer 202. The substrate 201 may be any appropriate substrate, such as a bulk semiconductor substrate, for instance in the form of a silicon substrate, a glass substrate or any other insulating substrate. In one particular embodiment, the substrate 201 may represent an SOI substrate including a buried insulating layer on which is formed the semiconductor layer 202. In other embodiments, the semiconductor layer 202 may represent a surface portion of a bulk semiconductor substrate. A gate electrode 203 formed of an appropriate gate electrode material, such as polysilicon for silicon-based semiconductor devices, is formed above the semiconductor layer 202 and is separated therefrom by a gate insulation layer 204. When sophisticated silicon-based CMOS devices are considered, the gate electrode 203 may exhibit a gate length, i.e., the horizontal dimension in FIG. 2a, of approximately 100 nm and even less, or even 50 nm and less, while the gate insulation layer 204 is designed in accordance with the gate length so as to provide the required capacitive coupling. For instance, a nitrogen-enriched silicon dioxide layer of a thickness of approximately 0.5–4.0 nm may be provided as the gate insulation layer 204. The transistor device 200 further comprises a cap layer 205, which may represent the residue of an anti-reflective coating. Moreover, a liner 206, for instance comprised of an oxide, such as silicon dioxide, is formed on sidewalls 203a of the gate electrode 203 and on surface portions of the semiconductor layer 202. Additionally, disposable spacer elements 207 are formed adjacent to the gate electrode 203, thereby covering the sidewalls 203a of the gate electrode 203 and a surface portion of the semiconductor layer 202 in the vicinity of the gate electrode 203, wherein a spacer width 207a determines the dimension of the covered surface portion of the layer 202.

For a silicon-based device 200, substantially the same process flow may be applied as previously explained with reference to FIG. 1a. For other semiconductor materials, corresponding process sequences for forming the various components of the device 200 as shown in FIG. 2a are well-established in the art and may then replace the respective process techniques as are used for a silicon-based device.

Figure 2B:
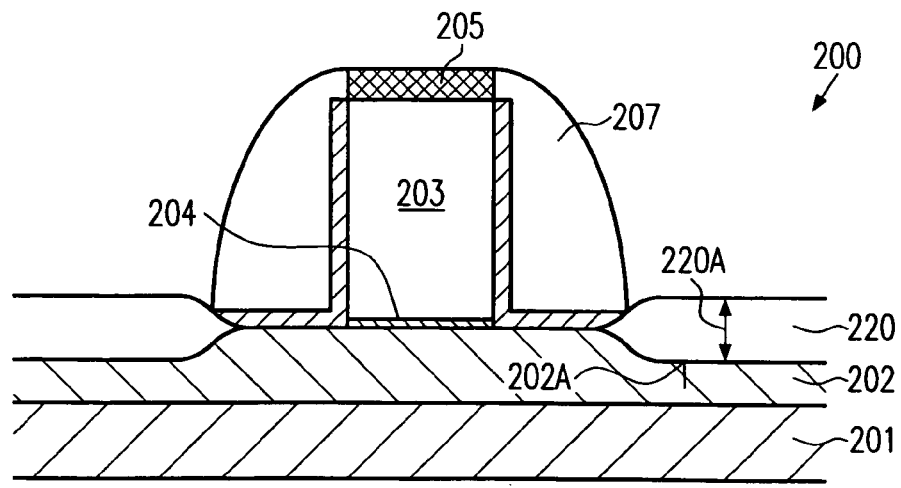

FIG. 2b schematically shows the transistor device 200 in an advanced manufacturing stage. The transistor 200 comprises an oxidized portion 220 that is formed substantially in those regions of the semiconductor layer 202 that are not covered by the gate electrode 203, the disposable spacers 207, and any isolation structures (not shown) enclosing the transistor 200. The oxidized portion 220 is formed by a well-controllable oxidation process, and hence a thickness 220a of the portion 220 may be precisely adjusted to the specific design requirements. For instance, the transistor device may be subjected to a thermal oxidation with a specified oxide growth rate. Corresponding oxidation processes are well-established in the art, since any liner oxides, gate oxides, and the like may frequently be formed by oxidation. In other embodiments, the selective oxidation may be performed by applying an oxidizing solution, such as a diluted mixture of sulfuric acid and hydrogen peroxide. Since the thickness 220a may be precisely controlled, the depth of a surface portion 202a, i.e., the position of the interface between the portion 220 and the non-oxidized semiconductor layer 202, is also well controlled. Accordingly, after removal of the oxidized portion 220, a precisely defined remaining semiconductor layer thickness is provided that may be used for receiving a specified epitaxially grown material.

Figure 2C:
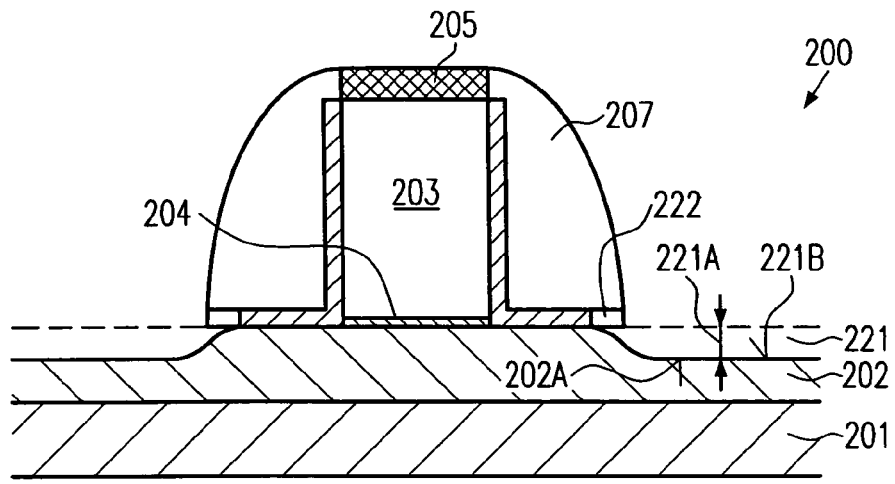

FIG. 2c schematically shows the device 200 after removal of the oxidized portion 220, thereby forming a recess 221 having a depth 221a that is related to the thickness 220a of the oxidized portion 220 by the ratio of the specific volumes of oxide and semiconductor material of the layer 202. The removal of the oxidized portion 220 may be accomplished by well-established selective dry or wet etch processes, wherein, in one embodiment, an isotropic etch recipe is used to remove the oxidized portion 220 without unduly damaging the surface 221b of the recess 221. When applying an isotropic etch process, the liner 206, which may be comprised of an oxide of the underlying semiconductor layer 202, such as silicon dioxide, may also be partially removed, thereby creating a certain under-etch area 222. For instance, if the semiconductor layer 202 is substantially comprised of silicon, the oxidized portion 220 may be selectively removed with respect to the cap layer 205 and the spacers 207 by hydrogenated fluoride (HF).

In other embodiments, the recess 221 may be formed by a corresponding dry or wet etch process without forming the oxidized portion 220, wherein the depth 221a may be controlled by adjusting the etch time for a given etch rate. Since the control of the depth 221a by means of adjusting an etch time is less precise compared to the formation of a slowly growing oxidized portion, the latter embodiment may be convenient for relaxed process requirements.

Thereafter, the exposed recesses 221 may be subjected to a cleaning process to remove oxide residues or other etch byproducts. Advantageously, forming the recess 221 prior to a selective epitaxial growth process also removes any contaminants that may have accumulated on surface portions of the semiconductor layer 202 in preceding processes. In some cases, contaminants such as carbon and oxygen may accumulate at surface portions up to a depth of approximately 3 nm, which may then negatively influence the subsequent epitaxial growth process. Hence, by forming the recesses 221, these contaminants are effectively removed.

Figure 2D:
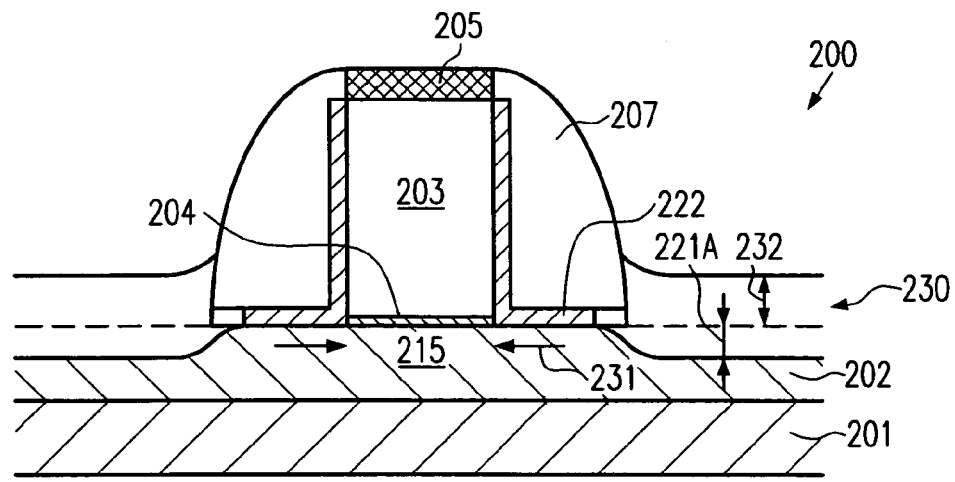

FIG. 2d schematically shows the transistor 200 with an epitaxially grown material 230 that completely fills the recess 221 and extends above a level defined by the gate insulation 204. The material 230 is comprised of one or more components that, upon deposition on the exposed surface of the semiconductor layer 202, form a crystalline structure that is similar to that of the semiconductor layer 202. In one particular embodiment, the semiconductor layer 202 is comprised of silicon and the material 230 comprises silicon and at least one additional component, such as germanium, carbon and the like, provided in an appropriate ratio so that the material 230 forms a crystalline structure similar to the underlying semiconductor layer 202, wherein the slight mismatch in the lattice structure, for instance caused by a different lattice spacing, leads to a strained region which exerts stress to adjacent material regions, such as a channel region 215 located below the gate insulation layer 204. For instance, the material 230 may comprise silicon and germanium in a mixture ratio of approximately 5–60 atomic percent germanium so that the corresponding material 230 exhibits an increased lattice spacing compared to a pure silicon structure as is provided in the semiconductor layer 202. As a consequence, the expansion of the silicon germanium material 230 creates a compressive stress, indicated by 231, within the channel region 215 and of course in the region located between the channel region 215 and the material 230. In other embodiments, a silicon carbon mixture, that is a silicon carbide material, may be provided in the material 230, which forms a lattice having a reduced lattice spacing compared to the silicon structure. Consequently, the silicon carbon material 230 will tend to expand the channel region 215 and therefore will create tensile stress in the channel region 215. By creating compressive or tensile stress in the channel region 215 and the neighboring regions, the mobility and thus the conductivity of these regions may be enhanced as previously described. The amount of tensile or compressive stress in the channel region 215 may be controlled for a given device geometry by selecting an appropriate material 230 and/or by selecting the depth 221a. For example, the ratio of compressive or tensile stress creating components in the material 230 may be dictated by the process parameters of the epitaxial growth process, wherein a thickness of the material 230 may significantly influence the magnitude of the mixture ratio so that it may be advantageous in some cases to reduce a thickness of the material 230 to a relatively low value while using a moderately high mixture ratio, for instance, for silicon and germanium, of up to 60 atomic percent germanium. In this way, the stress in the channel region 215 may finally be controlled by the depth 221a, which, as previously explained, may be precisely adjusted when a selective oxidation process is used. In one embodiment, the material 230 may be comprised of two or more distinct layers, such as a silicon germanium layer, followed by a silicon layer, or a plurality of alternating layers having different lattice spacings may be provided in the material 230. In one particular embodiment, the material 230 comprises a silicon layer as the very last layer to provide a high degree of compatibility with conventional process flows, for instance, if metal silicide regions are to be formed in the material 230.

The formation of the material 230 is accomplished by well-established epitaxial growth processes when commonly known material compositions, such as silicon germanium on silicon or silicon carbon on silicon and the like are used. If the semiconductor layer 202 is comprised of other semiconductor layers, corresponding growth recipes may be established on the basis of opto-electronic manufacturing processes and/or on the basis of experiments to determine appropriate mixture ratios for creating tensile or compressive stress. It may then be advantageous to precisely adjust a final height 232 of the material 230 with respect to the gate insulation layer 204 by providing an additional semiconductor layer that has the same lattice structure and lattice spacing as the semiconductor layer 202, since then the epitaxial growth parameters may be selected substantially independently from the final height 232. That is, the desired stress created in the channel region 215 may be controlled by the epitaxial growth parameters in combination with the depth 221a, whereas the height of raised drain and source regions, i.e., the height 232, may be adjusted by growing a pure semiconductor layer within the material 230, thereby substantially not affecting the parameters for defining the stress in the channel region 215.

In other embodiments, the material 230 may comprise, in addition or alternatively to a stress creating component, a dopant species in a specified concentration that enables the formation of a specified dopant profile, possibly in addition to further implantation cycles that are to be performed in a later manufacturing stage. For instance, a high dopant concentration may be introduced into the semiconductor layer 202 without damaging the crystalline structure, contrary to the case of an ion implantation sequence, thereby significantly relaxing the constraints with respect to the thermal budget in subsequent anneal cycles required for recrystallizing damaged crystalline semiconductor regions. The "deposition" of the dopant concentration may be controlled by adjusting the depth 221a and by adjusting the epitaxial growth parameters in which, for instance, the addition of the dopant species may be varied over time so as to establish a desired vertical dopant profile in the material 230. For example, if it is appropriate to locate high dopant concentration at a moderate depth 221a, recessing the semiconductor layer 202, for example by forming the oxidized portion 220 (FIG. 2b) may correspondingly be carried out and the highly doped material 230 may be deposited by epitaxial growth. If the corresponding depth 221a is, however, inappropriate for generating the required stress in the channel region 215, a pure semiconductor material, except for the high dopant concentration, may first be deposited, followed by a stress-creating component. In other embodiments, it may be considered appropriate to merely modify the dopant concentration by depositing a doped semiconductor material without any stress-generating component. Since especially the recessing by forming oxidized portions 220 enables a precise control of the depth 221a, a more precise dopant profiling is accomplished compared to the conventional process flow as described with reference to FIGS. 1a–1d.

Figure 2E:
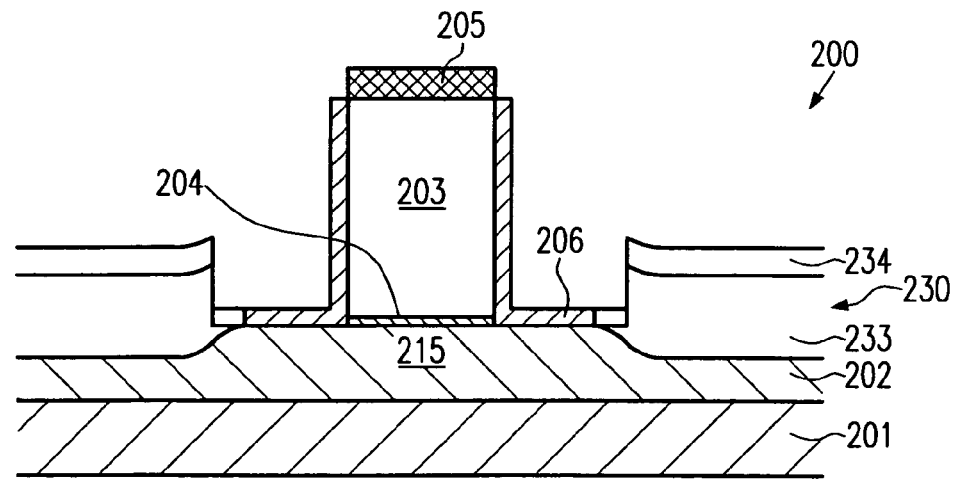

FIG. 2e schematically shows the device 200 after the removal of the disposable spacer 207 and with the material 230, which in the present example is shown as a material comprising a stress creating layer 233 and a non-stress creating layer 234. That is, the stress creating layer 233 may comprise a material that does not exactly match the lattice structure and/or spacing of the semiconductor layer 202, whereas the non-stress creating layer 234 may be comprised of the same crystalline material as the semiconductor layer 202. The layers 233 and 234 may be formed during the epitaxial growth process by correspondingly using appropriate precursor materials. For instance, the layer 233 may comprise silicon and germanium or silicon and carbon, whereas the layer 234 may comprise silicon if the semiconductor layer 202 is comprised of silicon.

The removal of the spacer 207 and of the cap layer 205 may be performed as is described in the conventional process flow and may, in one particular embodiment, be achieved by hot phosphoric acid when the spacer 207 and the cap layer 205 are substantially comprised of silicon nitride. Thereafter, a conventional process flow for forming a field effect transistor may be applied to the device 200, wherein, depending on whether the material 230 contains a dopant species or not, a more efficient dopant profiling and/or a reduced thermal budget may be achieved.

Figure 2F:
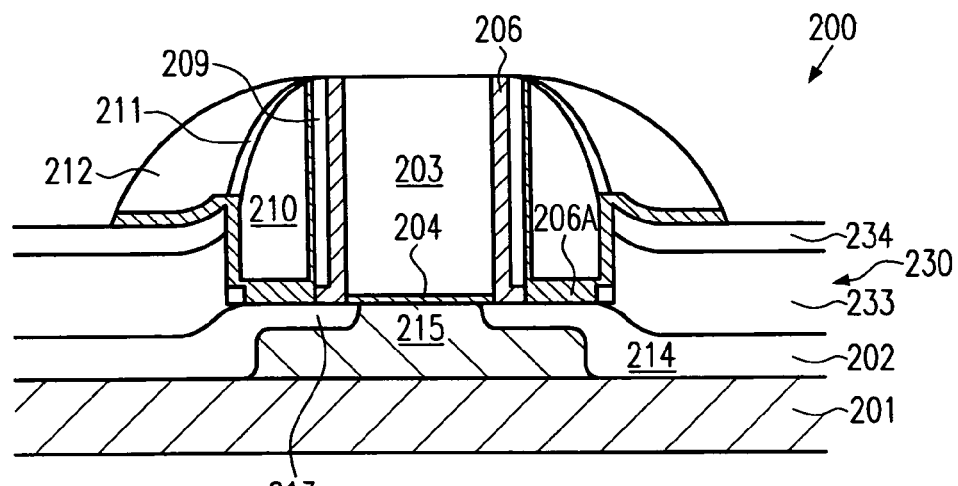

FIG. 2f schematically shows the device 200 in a very advanced manufacturing stage, wherein a plurality of spacers 209, 210 and 212 are formed adjacent to the gate electrode 203. Furthermore, extensions 213 and, associated therewith, respective source and drain regions 214 are formed to enclose the channel region 215. It should be appreciated that the transistor 200 having the plurality of spacers as illustrated in FIG. 2f is illustrative in nature only, and any other sidewall spacer structure may be used when considered appropriate for a specific device design.

Figure 1D:
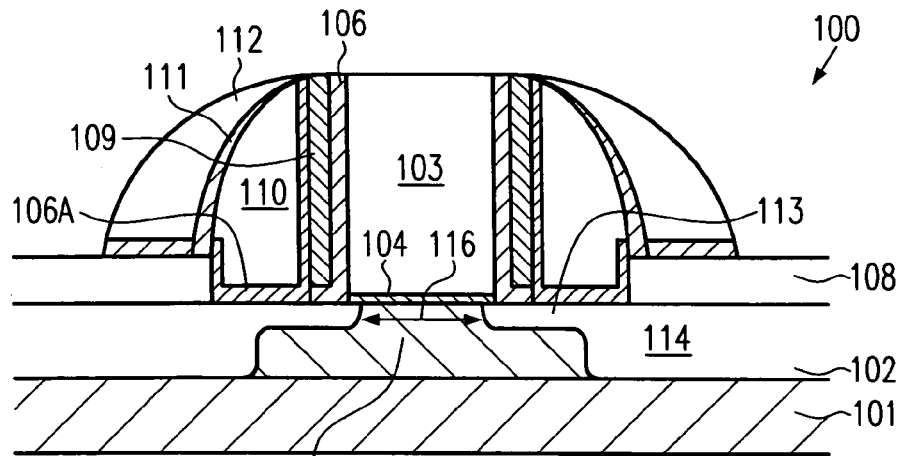

The formation of the transistor 200 as shown may substantially include the same process sequences as already described with reference to FIG. 1d. That is, the spacer 209, for instance in the form of an oxide liner, may be deposited and subsequently an additional liner 206a may be formed as is described in the conventional process flow. The spacer 209 may also be provided in the form of a nitride spacer as is also described in the conventional process flow. The spacer 209 may be used as an offset for a corresponding implantation cycle for forming a dopant profile in the vicinity of the gate electrode 203. Thereafter, the spacer 210 may be formed, for instance, of silicon nitride, by well-established process techniques and may be used as a further implantation mask for profiling the extensions 213. After forming a further liner 211, for instance comprised of silicon dioxide, the spacer 212 may be patterned and may be used in a subsequent implantation sequence to form the drain and source regions 214. Finally, an appropriately designed anneal sequence is performed to activate the dopants and recrystallize, at least partially, implantation-induced damage in the corresponding regions in the semiconductor layer 202 and the material 230. In embodiments using a high dopant concentration during the epitaxial growth of the material 230, the dopants introduced without implantation may assist in adequately profiling the extensions 213 and the drain and source regions 214 without contributing to the crystal damage. Accordingly, the implantation sequence may be adapted to the dopant concentration as deposited, thereby relaxing the constraints for the anneal cycles and/or providing a more precisely defined dopant profile.

Thereafter, further processing may be continued, for instance, by forming silicide regions in the material 230 and the gate electrode 203 by well-established silicidation processes. In other process strategies, a metal silicide in the material 230 may not be required.

As a consequence, by providing the material 230 containing a dopant species and/or a stress-creating component, the device characteristics may be improved. In particular, when a stress-creating component is present in the region 230, the carrier mobility may be enhanced and thus the drive current capability of the transistor 200 is improved for a given rate of leakage current. Moreover, the transistor 200 may be formed in accordance with well-established process flows for forming raised drain and source regions, wherein especially the recessing of the semiconductor layer 202 by a local oxidation for thinning the semiconductor layer 202 provides improved control for the thickness of the semiconductor layer prior to the selective epitaxial growth process, which is particularly advantageous for SOI devices, thereby still enhancing the transistor performance thereof.

Figure 3A:
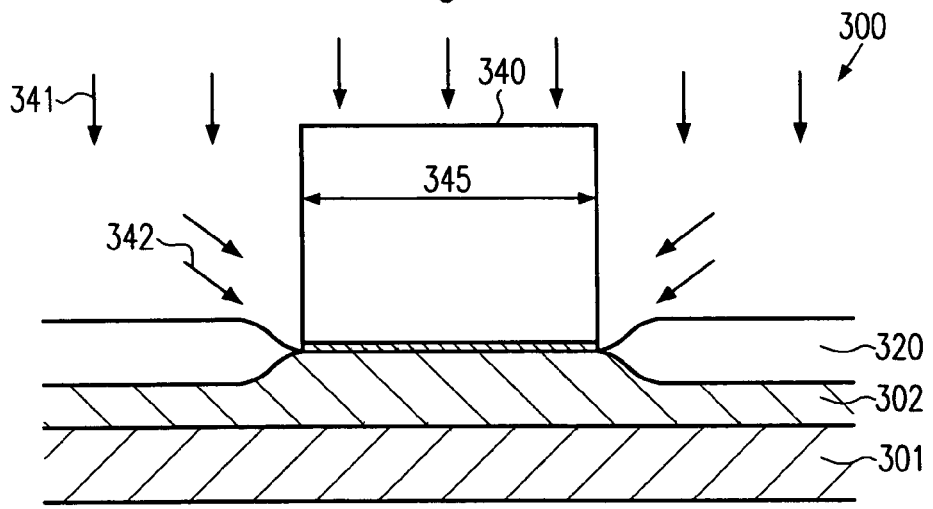
FIGS. 3a–3f schematically show cross-sectional views of a transistor element during various manufacturing stages, wherein a stress-inducing layer is formed adjacent to a disposable oxidation mask, which may act as a replacement for an electrode structure.

With reference to FIGS. 3a–3f, further illustrative embodiments of the present invention will now be described. FIG. 3a schematically shows a cross-sectional view of the transistor 300 at an early manufacturing stage. The transistor 300 comprises a substrate 301 having formed thereon a substantially crystalline semiconductor layer 302, such as a silicon layer. Locally oxidized portions 320 are formed adjacent to an oxidation mask 340, which may be comprised of, for instance, silicon nitride formed on a thin silicon dioxide etch stop layer 344. The lateral dimension of the oxidation mask 340, indicated by the double arrow 345, may be selected to act as a replacement for an electrode structure that is to be formed after removal of the oxidation mask 340, wherein the actual dimension 345 may significantly exceed a desired length of the gate structure to be formed. The oxidized portion 320 may be formed by any appropriate oxidation method, for instance by exposing the structure 300 to an oxidizing ambient and/or by applying an oxidizing solution to the device 300. Regarding a thickness of the oxidized portion 320, the same criteria apply as previously pointed out with reference to FIG. 2b.

The device 300 as shown in FIG. 3a may be formed by well-established techniques including the deposition of a silicon nitride layer, patterning the same by photolithography to form the oxidation mask 340, and thereafter oxidizing the structure 300 to form the oxidized portion 320. Then, an implantation 341, possibly including any tilted implant sequences 342 to create a specified dopant profile in the semiconductor layer 302, may be performed. In other embodiments, the implantation cycles 341 and 342 may be omitted at this stage and may be performed in a later manufacturing phase, as will be described further on. Thereafter, the oxidized portion 320 may be selectively removed, for instance by applying hydrogenated fluoride (HF) to form corresponding recesses (not shown) adjacent to the oxidation mask 340. Subsequently, any pre-cleaning processes may be carried out and then an epitaxial growth process is performed to deposit a material adjacent to the oxidation mask 340 with a height in accordance with design requirements.

Figure 3B:
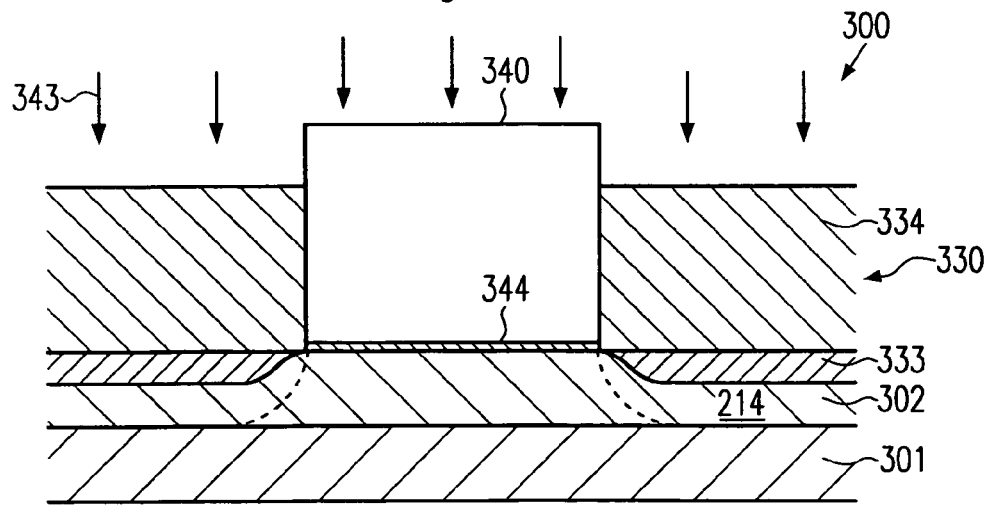

FIG. 3b schematically shows the device 300 after completion of the epitaxial growth process, wherein a material 330 is formed adjacent to the oxidation mask 340. As previously discussed with reference to FIGS. 2c and 2d, the material 330 may comprise a stress-creating component and/or a dopant species. For instance, the epitaxially grown material 330 may be comprised of a stress-creating material composition, for instance, a mixture of silicon germanium or silicon carbon, forming a first layer 333, followed by a second layer 334, for instance comprised of silicon in doped or non-doped form. Similarly, the first layer 333 may comprise a specified dopant concentration, in addition to or alternatively to the stress-creating component to replace or complete a respective ion implantation for forming drain and source regions. To this end, the amount of dopant species may be correspondingly varied or adjusted during the epitaxial growth process and the depth, i.e., a thickness of the oxidized portion 320, may be correspondingly adjusted, as is similarly discussed with reference to FIG. 2d. In other embodiments, in addition or as an alternative to introducing a dopant species into the material 330, a further implantation 343 may be performed to create source and drain regions 314. Thereafter, the oxidation mask 340 may be selectively removed, for instance by applying hot phosphoric acid, and a corresponding spacer layer may be conformally deposited.

Figure 3C:
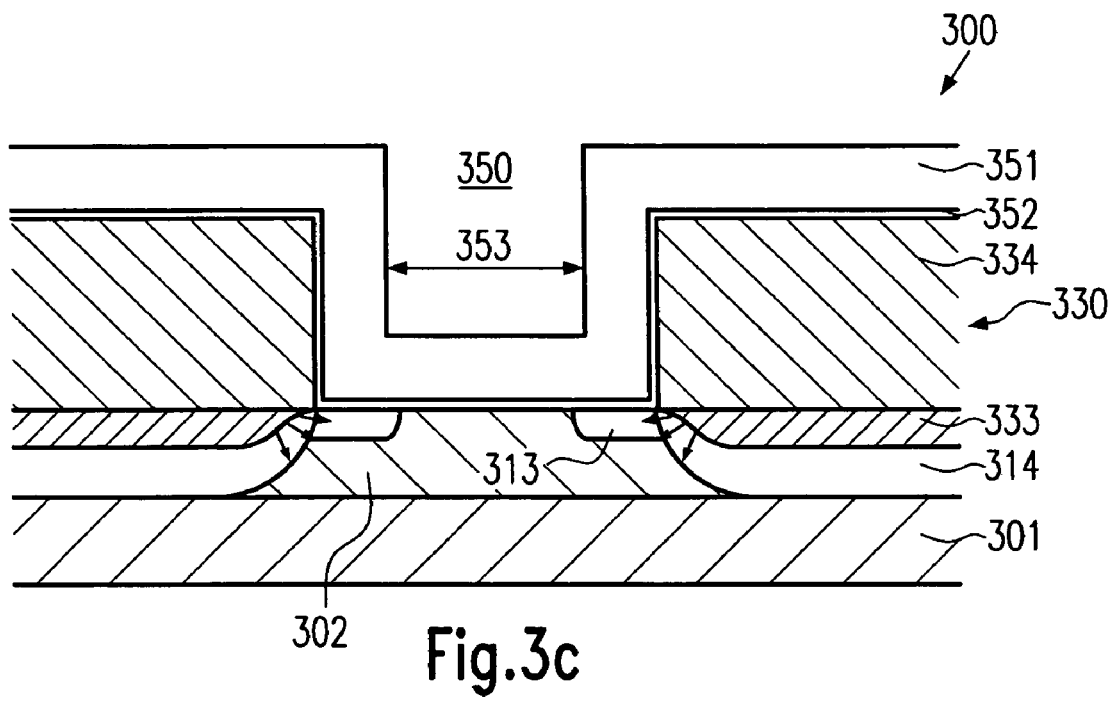

FIG. 3c schematically shows the device 300 after completion of the above process sequence. The device 300 includes an opening 350 and a spacer layer including a first layer 351 and a second layer 352 that are conformally formed within the opening 350 and on top of the material 330. The first layer 352 may be comprised of any appropriate material for forming a gate insulation layer, such as a nitrogen-containing silicon dioxide with a required thickness, while the second layer 351 may be comprised of silicon nitride having a thickness to define a finally required gate length 353. Furthermore, extension regions 313 are formed adjacent to the drain and source regions 314.

A typical process flow for forming the device shown in FIG. 3c may comprise the following processes. Prior to or after the removal of the oxidation mask 340 and the etch stop layer 344, an anneal cycle may be performed which is designed in such a way that the extensions 313 are formed by dopant diffusion wherein, in particular, the high dopant concentration in the layer 333 feeds the diffusion process to form the extensions 313. During the anneal cycle, any crystal damage may substantially be cured if preceding implantation cycles such as the implantation 343 and/or the implantations 341 and 342 have been performed. After removal of the oxidation mask 340, the layer 352 is conformally deposited with a thickness and composition as is required for a gate insulation layer. To this end, any well-established oxidation and/or deposition technique may be used. Subsequently, the layer 351 is deposited, for example by plasma enhanced chemical vapor deposition, wherein a thickness of the layer 351 is adjusted to obtain a desired gate length 353 within the opening 350. Consequently, the gate length 353 is finally determined by a deposition process rather than by a photolithography patterning process. Thereafter, the layer 351 may be anisotropically etched selectively to the layer 352, thereby exposing the layer 352 within the opening 350.

Figure 3D:
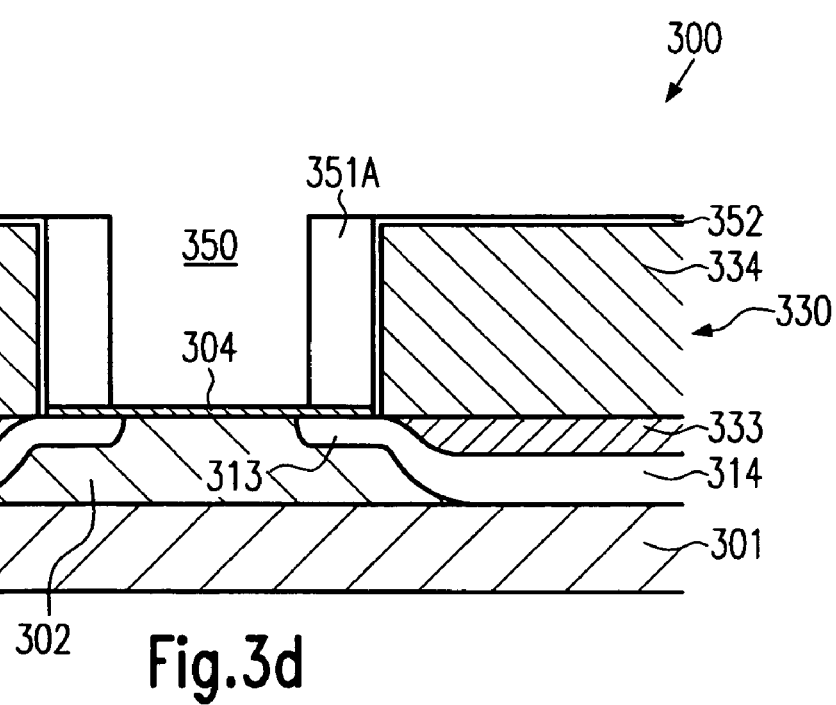

FIG. 3d schematically shows the resulting structure after completion of the anisotropic etch process. A spacer 351a is formed adjacent to sidewalls of the opening 350 and the layer 352 is exposed within the opening 350, which is now also referred to as a gate insulation layer 304.

Figure 3E:
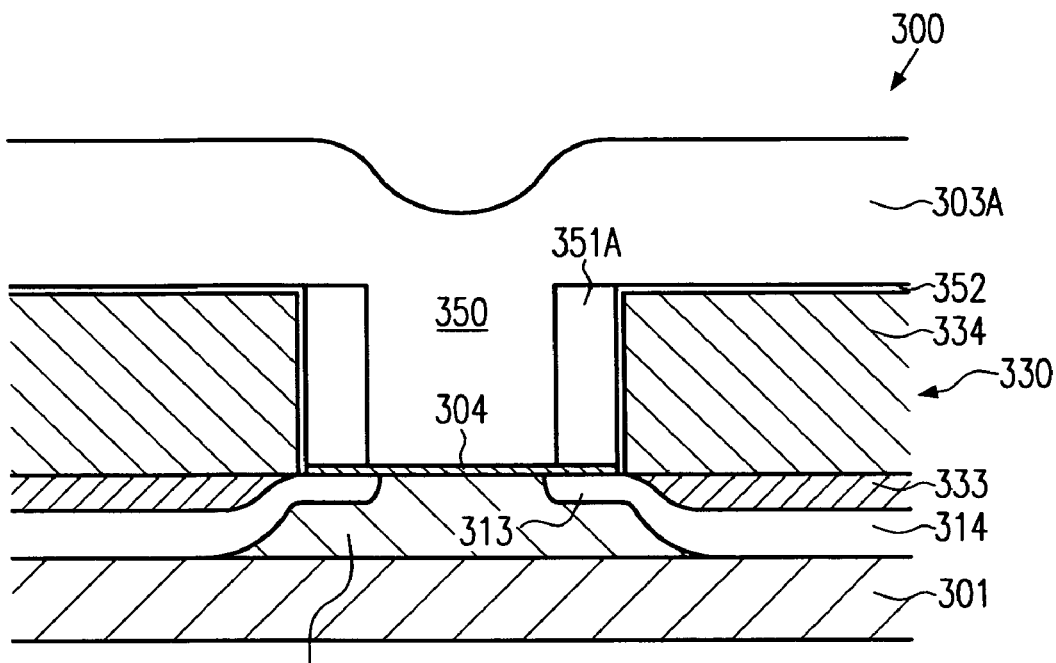

FIG. 3e schematically shows the device 300 with a layer of gate electrode material, such as polysilicon, indicated as 303a, deposited to completely fill the opening 350. The deposition of the layer 303a may be accomplished by sophisticated chemical vapor deposition techniques. Thereafter, any excess material of the layer 303a may be removed by etching and/or chemical mechanical polishing (CMP), wherein, preferably, the removal process is continued after exposing the layer 334 to provide reliable electrical insulation of the polysilicon within the opening 350 and the layer 334 separated therefrom by the spacer 351a and the gate insulation layer 304.

Figure 3F:
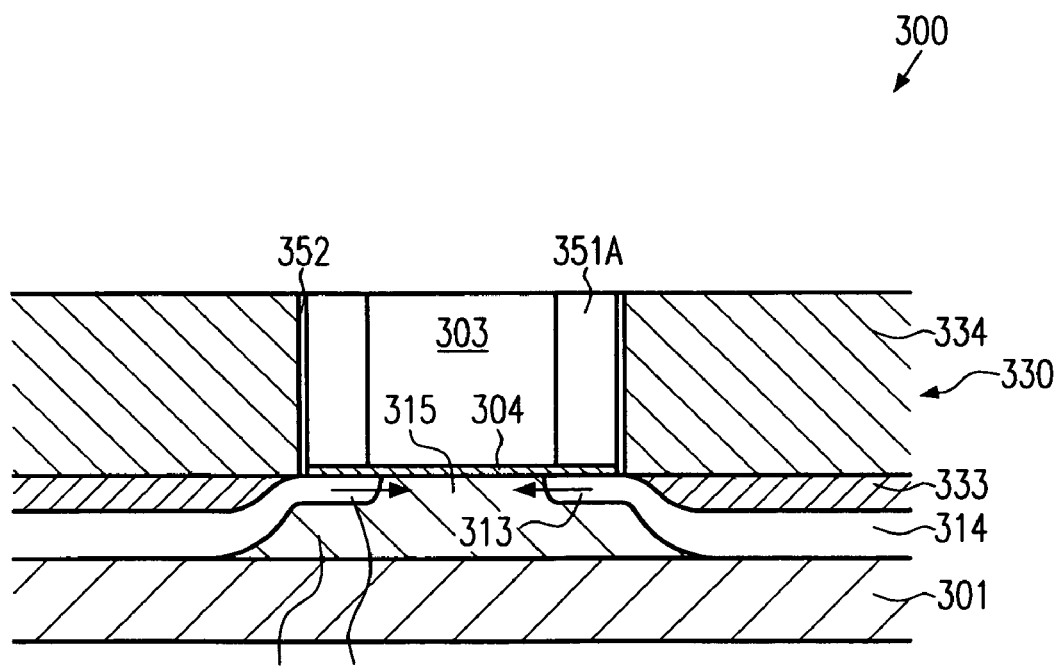

FIG. 3f schematically shows the device 300 after removal of the excess material of the layer 303a, thereby forming a gate electrode 303 that is electrically insulated from the neighboring raised drain and source regions 334.

As a consequence, by recessing the semiconductor layer 302 by means of the oxidation mask 340 and a selective oxidation process prior to an epitaxial growth process for forming the raised drain and source regions 334, a dopant species and/or a stress-generating component may be effectively introduced in the vicinity of a channel region 315 prior to forming a corresponding gate electrode structure. In one particular embodiment, at least the layer 333 of the epitaxially grown material 330 comprises a stress-inducing component, such as silicon/germanium or silicon/carbon, thereby exerting an illustrative compressive stress, indicated by 331, to the channel region 315 to increase the charge carrier mobility and thus the conductivity therein. As previously explained, the mobility of holes for P-channel transistors may be increased by generating a compressive stress while the mobility of electrons for an N-channel transistor may be increased by generating a tensile stress in the channel region 315.

As a result, the present invention provides an efficient technique for providing dopant species and/or a stress-inducing component in the vicinity of a channel region of a field effect transistor by recessing a semiconductor layer prior to performing an epitaxial growth process for forming raised drain and source regions. In some embodiments, the recessing is achieved by selectively oxidizing the semiconductor layer, thereby achieving a high degree of controllability in thinning the underlying semiconductor layer. Consequently, the amount of stress and/or dopant species introduced into the semiconductor layer may be generated with high precision, thereby contributing to device uniformity. Irrespective of whether a gate electrode structure is formed prior to or after the epitaxial growth process, a high degree of compatibility with established conventional process flows is still preserved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a mask above a semiconductor layer;
    removing a portion of said semiconductor layer exposed by said mask to form a recess adjacent to said mask;
    forming a material in said recess to extend above a surface portion of said semiconductor layer covered by said mask, said material having a lattice constant that differs from that of said semiconductor layer to create stress in a region adjacent to and below said mask;
    removing said mask to expose sidewalls of said material and said surface portion;
    forming a spacer over at least said sidewalls;
    forming a gate electrode structure over said surface portion between said sidewalls after the formation of the spacer.

2. The method of claim 1, further comprising adjusting a stress in a channel region located below said mask by controlling at least one of a depth of said recess and the composition of said material.

3. The method of claim 1, wherein said material comprises at least one component that forms a lattice having a greater lattice constant compared to said semiconductor layer to create a compressive stress in a P-doped channel region located below said mask.

4. The method of claim 1, wherein said material comprises at least one component that forms a lattice having a lattice constant less than that of said semiconductor layer to create a tensile stress in an N-doped channel region located below said mask.

5. The method of claim 1, wherein forming said material further comprises epitaxially growing said material.

6. The method of claim 5, wherein epitaxially growing said material includes introducing a dopant species into said material.

7. The method of claim 1, further comprising:
selectively oxidizing exposed portions of said semiconductor layer; and
removing said selectively oxidized portions of said semiconductor layer to form said recess.

8. The method of claim 7, further comprising controlling said selective oxidation of the exposed portions of said semiconductor layer to adjust a depth of said recess to a predefined target value.

9. The method of claim 1, wherein forming the spacer further comprises:
forming a first gate insulating layer over said sidewalls and said surface portion;
forming a second layer over the first gate insulating layer; and
removing a portion of the second layer above said surface portion.

10. The method of claim 1, wherein said material comprises at least two different layers with differing lattice constants.

11. The method of claim 10, wherein a last layer of said material is the same material that forms said semiconductor layer.

12. The method of claim 1, wherein said material comprises a dopant of opposite conductivity type than a conductivity type of a channel region located below said gate electrode.

* * * * *